(12) United States Patent
Seidel

(10) Patent No.: US 7,126,345 B2
(45) Date of Patent: Oct. 24, 2006

(54) INTEGRATED CIRCUIT CAPABLE OF REDUCED ERROR CALIBRATION

(75) Inventor: Mark N. Seidel, Florence, AZ (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 11/021,057

(22) Filed: Dec. 23, 2004

(65) Prior Publication Data
US 2006/0139190 A1  Jun. 29, 2006

(51) Int. Cl.
*G01R 35/00* (2006.01)
*G01D 18/00* (2006.01)

(52) U.S. Cl. ......................................... 324/601; 702/85
(58) Field of Classification Search ................ 324/601, 324/600, 202, 130; 702/85; 257/48
See application file for complete search history.

(56) References Cited

U.S. PATENT DOCUMENTS

| | | | | |
|---|---|---|---|---|
| 5,621,409 A * | 4/1997 | Cotter et al. | ................ | 341/156 |
| 5,717,321 A * | 2/1998 | Kerth et al. | ................ | 323/283 |
| 6,603,356 B1 * | 8/2003 | Kim et al. | .................. | 330/265 |
| 6,608,507 B1 * | 8/2003 | Garrett et al. | .............. | 327/108 |
| 6,825,490 B1 * | 11/2004 | Hook et al. | ................... | 257/48 |
| 6,836,126 B1 * | 12/2004 | Lin | ............................ | 324/601 |
| 6,940,303 B1 * | 9/2005 | Vargas | ......................... | 326/30 |
| 6,958,613 B1 * | 10/2005 | Braun et al. | ................ | 324/601 |
| 2006/0066315 A1 * | 3/2006 | Monceau et al. | ........... | 324/601 |

* cited by examiner

*Primary Examiner*—Anjan Deb
*Assistant Examiner*—Hoai-An D. Nguyen
(74) *Attorney, Agent, or Firm*—Grossman, Tucker, Perreault & Pfleger, PLLC

(57) ABSTRACT

A method according to one embodiment may include generating, by an integrated circuit including calibration controller circuitry including a comparator, at least one reference voltage. The method of this embodiment may also include calibrating, by the calibration controller circuitry, at least one reference current signal by comparing, by the comparator, a signal proportional to the reference current signal and at least one reference voltage. The method of this embodiment may further include calibrating, by the calibration controller circuitry, at least one resistance value control signal, by comparing, by the comparator, a signal proportional to at least one resistance value control signal and at least one reference voltage. Of course, many alternatives, variations, and modifications are possible without departing from this embodiment

24 Claims, 5 Drawing Sheets

INTEGRATED CIRCUIT CAPABLE OF REDUCED ERROR CALIBRATION

FIELD

The present disclosure relates to an integrated circuit capable of reduced error calibration.

BACKGROUND

In one conventional integrated circuit, circuit parameters may be calibrated. To calibrate a plurality of signals and/or circuit parameters, the conventional integrated circuit may use different comparators for each task, where the comparators may be used to compare a reference signal to a signal that is to be calibrated. However, in such an arrangement, the use of multiple comparators tends to introduce excessive and random error in the calibration process. The conventional integrated circuit is incapable of reducing calibration errors since the conventional integrated circuit does not calibrate a plurality of parameters using a single comparator.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

Figure 1:
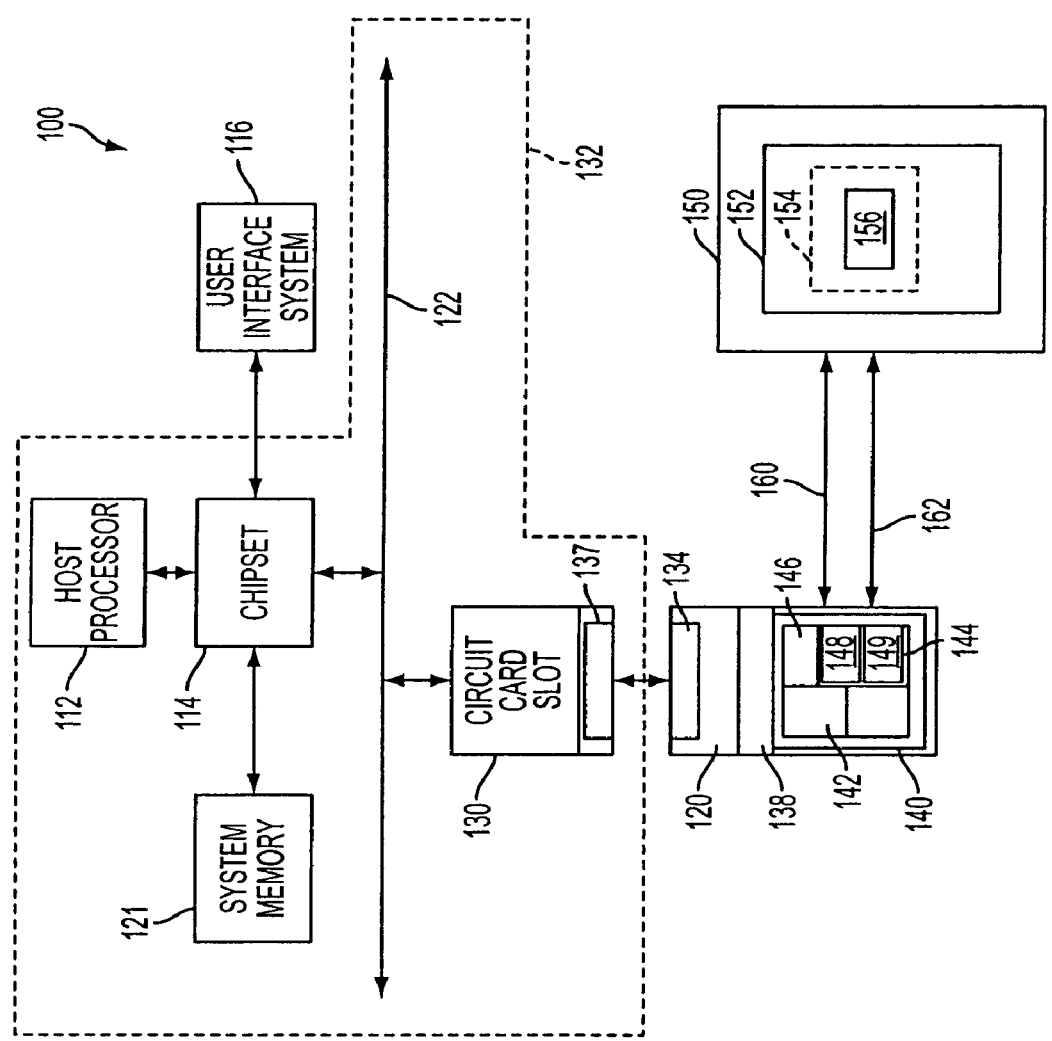
FIG. 1 is a diagram illustrating a system embodiment.

FIG. 1 illustrates a system embodiment 100 of the claimed subject matter. The system 100 may generally include a host system 132 which may include a host processor 112, a bus 122, a user interface system 116, a chipset 114, system memory 121, a circuit card slot 130, and a circuit card 120 that is capable of communicating with the mass storage 150. The host processor 112 may include any variety of processors known in the art such as an Intel® Pentium® IV processor commercially available from the Assignee of the subject application. The bus 122 may include various bus types to transfer data and commands. For instance, the bus 122 may comply with the Peripheral Component Interconnect (PCI) Express™ Base Specification Revision 1.0, published Jul. 22, 2002, available from the PCI Special Interest Group, Portland, Oreg., U.S.A. (hereinafter referred to as a "PCI Express™ bus"). The bus 122 may also comply with the PCI-X Specification Rev. 1.0a, Jul. 24, 2000, available from the aforesaid PCI Special Interest Group, Portland, Oreg., U.S.A. (hereinafter referred to as a "PCI-X bus").

The user interface 116 may include a variety of devices for human users to input commands and/or data and to monitor the system such as a keyboard, pointing device, and video display. The chipset 114 may include host bridge/hub system (not shown) that couples the processor 112, system memory 121, and user interface system 116 to each other and to the bus 122. Chipset 114 may include integrated circuit chips, such as those selected from integrated circuit chipsets commercially available from the assignee of the subject application (e.g., graphics memory and I/O controller hub chipsets), although other integrated circuit chips may also, or alternatively be used. The processor 112, system memory 121, chipset 114 and circuit card slot 130 may be integrated onto a motherboard. The processor 112, system memory 121, chipset 114 and circuit card slot 130 may comprise a host system 132.

The circuit card 120 may be constructed to permit it to be inserted into slot 130. When the circuit card 120 is properly inserted into slot 130, connectors 134 and 137 become electrically and mechanically coupled to each other. When connectors 134 and 137 are so coupled to each other, the card 120 becomes electrically coupled to bus 122 and may exchange data and/or commands with system memory 121, host processor 112, and/or user interface system 116 via bus 122 and chipset 114. Alternatively, without departing from this embodiment, the operative circuitry of the circuit card 120 may be included in other structures, systems, and/or devices. These other structures, systems, and/or devices may be, for example, in the motherboard 132, coupled to the bus 122. Processor 112, system memory 121, chipset 114, bus 122, and circuit card slot 130 may be comprised in a single circuit board. Alternatively, and without departing from this embodiment, circuit card 120 may comprise one or more chipsets comprised in a system motherboard.

The circuit card 120 may communicate with mass storage 150 using a plurality of communication protocols. Circuit card 120 may comprise a host bus adaptor (HBA) which may be capable of exchanging commands and data between processor 112 and mass storage 150. The circuit card 120 may comprise at least one integrated circuit 140 capable of initiating communication between the host system 132 and mass storage 150. As used in any embodiment herein, an "integrated circuit" means a semiconductor device and/or microelectronic device, such as, for example, but not limited to, a semiconductor integrated circuit chip.

The circuit card 120 may also comprise memory 138. Memory 138 may comprise one or more of the following types of memories: semiconductor firmware memory, programmable memory, non-volatile memory, read only memory, electrically programmable memory, random access memory, flash memory, magnetic disk memory, and/or optical disk memory. Either additionally or alternatively, memory 138 may comprise other and/or later-developed types of computer-readable memory. Machine-readable firmware program instructions may be stored in memory 138. As described below, these instructions may be accessed and executed by integrated circuit 140. When executed by integrated circuit 140, these instructions may result in integrated circuit 140 performing the operations described herein as being performed by integrated circuit 140. Additionally, and as will be described in more detailed below, memory 138 and/or other memory (not shown) may be capable of storing data which may be associated with the operation of integrated circuit 140.

If a Fibre Channel (FC) protocol is used by circuit card 120 to exchange data and/or commands with mass storage 150, it may comply or be compatible with the interface/protocol described in "ANSI Standard Fibre Channel Physical and Signaling Interface-3 X3.303:1998 Specification.", and/or related versions. Alternatively or additionally, if a Serial ATA (SATA) protocol is used by controller circuit card 120 to exchange data and/or commands with mass storage 150, it may comply or be compatible with the protocol described in "Serial ATA: High Speed Serialized AT Attachment," Revision 1.0a, published on Jan. 7, 2003 by the Serial ATA Working Group and/or the protocol described in "Serial ATA II: Extensions to Serial ATA 1.0a," Revision 1.2, published Aug. 27, 2004 by the Serial ATA Working Group and/or earlier and/or later published versions of the SATA standard. Further alternatively or additionally, if a Serial Attached Small Computer System Interface (SAS) protocol is used by controller circuit card 120 to exchange data and/or commands with mass storage 150, it may comply or be compatible with the protocol described in "Information Technology—Serial Attached SCSI—1.1," Working Draft American National Standard of International Committee For Information Technology Standards (INCITS) T10 Technical Committee, Project T10/1562-D, Revision 1, published Sep. 18, 2003, by American National Standards Institute (hereinafter termed the "SAS Standard") and/or earlier and/or later published versions of the SAS Standard.

Circuit card 120 may be coupled to mass storage 150 via one or more network communication links 160, 162. In this embodiment, mass storage 150 may comprise, e.g., one or more redundant arrays of independent disks (RAID) 152. RAID 152 may comprise, for example, one or more disk mass storage devices and/or one or more peripheral devices (collectively shown in FIG. 1 by the block referred to by numeral 156) comprised in a protocol domain 154. As used herein, "protocol domain" means one or more apparatus that may communicate in accordance with a communication protocol. Also, in this embodiment, depending at least in part on the communications protocol used by integrated circuit 140 to communicate with mass storage 150, communication links 160 and 162 may comprise a differential pair communication data transmission link, which in combination may be capable of communicating commands and/or data to and/or from integrated circuit 140 to and/or from mass storage 150. Alternatively or additionally, depending at least in part on the communications protocol used by integrated circuit 140 to communicate with mass storage 150, communication links 160 and 162 may transmit common-mode signals, which in combination may be capable of disturbing and/or interfering with the correct transmission and reception of commands and/or data to and/or from integrated circuit 140 to and/or from mass storage 150.

Integrated circuit 140 may comprise protocol initiator circuitry 142 ("initiator circuitry 142"). As used in any embodiment herein, "circuitry" may comprise, for example, singly or in any combination, hardwired circuitry, programmable circuitry, state machine circuitry, and/or firmware that stores instructions executed by programmable circuitry. Also, in any embodiment herein, circuitry may be embodied as, and/or form part of, one or more integrated circuits. In this embodiment, initiator circuitry 142 may exchange commands and/or data with mass storage 150, via links 160 and 162, using, for example, a SATA communication protocol, a SAS communication protocol and/or a FC communication protocol.

Integrated circuit 140 may also comprise analog front end (AFE) circuitry 144. AFE circuitry 144 may be capable of generating one or more signals in accordance a protocol used by initiator circuitry 142. For example, AFE circuitry 144 may be capable of generating at least one output signal having an amplitude that complies or is compatible with the aforementioned SAS, SATA and/or FC communication protocols. At least one output signal generated by AFE circuitry 144 may be transmitted to and from mass storage 150 via communication links 160 and/or 162. In this embodiment, integrated circuit 140 may include a plurality of respective initiator engine circuitries 142 and AFE circuitries 144, one for each respective communication protocol (which may comprise a FC, SAS and/or SATA communications protocol) and/or multiple instances of initiator engine circuitry 142 and AFE circuitry 144 for one or more communications protocol (which may comprise a FC, SAS and/or SATA communications protocol).

In this embodiment, AFE circuitry 144 may include one or more termination resistors 149 and transmit amplifier (Tx) circuitry 148. Tx circuitry 148 may be capable of transmitting one or more signals that comply with a communications protocol (e.g., FC, SAS, and/or SATA), among a plurality of communication protocols. Integrated circuit 140 may generate a reference current, and Tx circuitry 148 may receive the reference current and a data signal and amplify the data signal, based on the reference current, to comply with a communications protocol, for example, FC, SAS and/or SATA communications protocol. One or more termination resistors 149 may be placed along communications link 160 and/or 162, i.e., between the output of TX circuitry 148 and mass storage 150. Termination resistors 149 may each comprise a variable resistor, and each may have a resistance value as may be specified for command and/or data transmission by FC, SAS and/or SATA communication protocol.

Although not shown in the drawings, transmit circuitry 148 and one or more termination resistors 149 taken together may form a portion of one or more physical interfaces (PHY) capable of electrically coupling circuit card 120 with storage array 150. A "PHY" may be defined as an object and/or circuitry used to interface to one or more devices, and such object and/or circuitry may be defined by one or more of the communication protocols set forth herein. The PHY may comprise a physical PHY containing transceiver circuitry to interface to the applicable communication link. The PHY may alternately and/or additionally comprise a virtual PHY to interface to another virtual PHY or to a physical PHY. A port may contain one or more PHYs. For example, a narrow port may contain only one PHY, while a wide port may contain more than one PHY.

Integrated circuit 140 may also comprise calibration controller circuitry 146. In this embodiment, calibration controller circuitry 146 may be capable of calibrating one or more reference current values used by one or more Tx circuitry 148 and/or other circuit blocks within the PHY that utilize one or more reference currents. Calibration controller circuitry 146 may also be capable of generating one or more termination resistance signals, each of which may operate to set a termination resistance value for one or more termination resistors 149. In this embodiment, calibration controller circuitry 146 may be capable of calibrating a reference current value and/or generating one or termination resistance signals using a single comparator.

Figure 2:
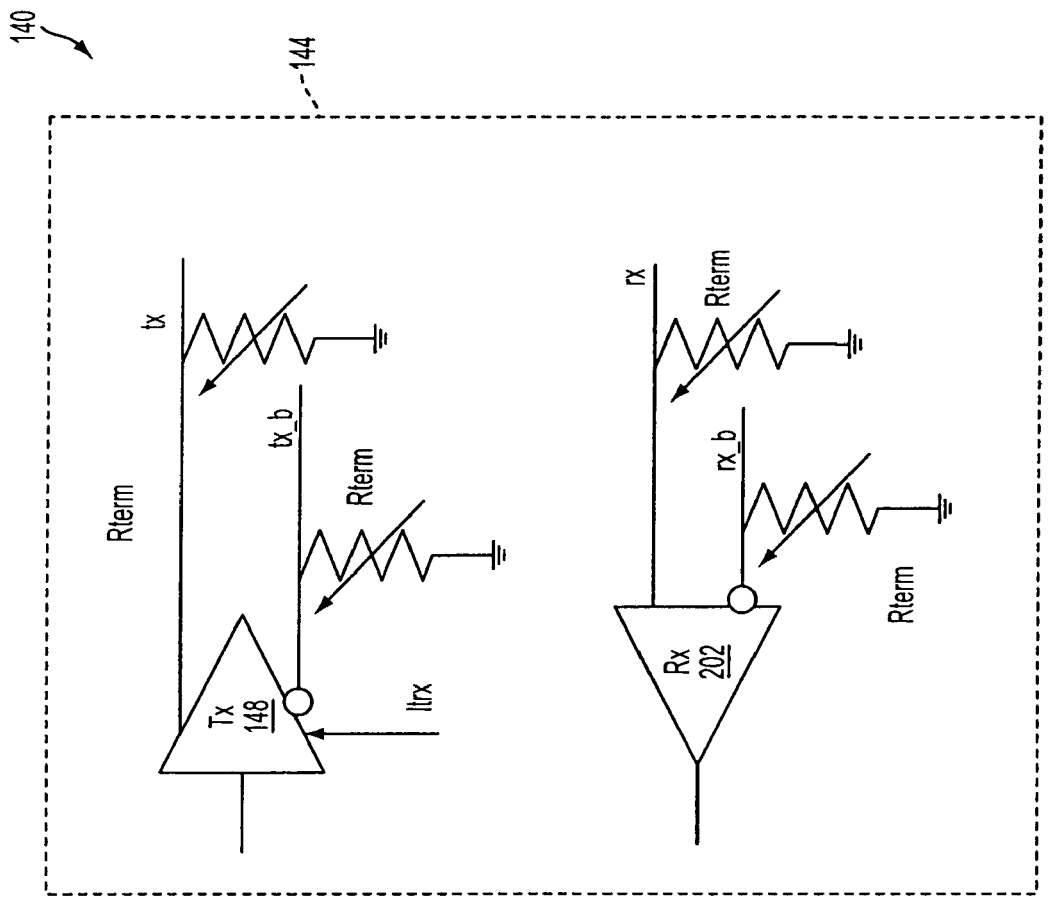
FIG. 2 is a diagram illustrating in more detail an integrated circuit according to an embodiment.
Figure 2:
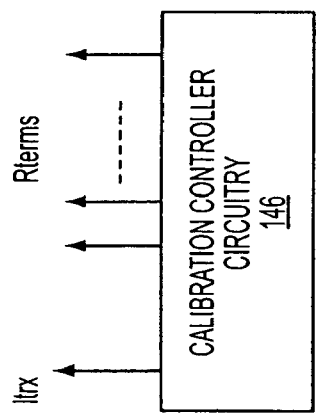

FIG. 2 illustrates in greater detail certain portions of integrated circuit 140. In particular, FIG. 2 illustrates in greater detail AFE circuitry 144 and calibration controller circuitry 146. In FIG. 2, certain portions of the system 100 depicted in FIG. 1 have been omitted for clarity (for example circuit board 132 and circuit card 120), but it is to be understood that like parts of FIG. 2 can be implemented in a manner consistent with an embodiment depicted in FIG. 1, or alternatively in other system implementations, without departing from this embodiment.

AFE circuitry 144, in this embodiment, may comprise transmit circuitry 148 and receive circuitry 202. Depending on the communications protocol used by integrated circuit 140, transmit circuitry 148 may be capable of generating one or more output signals according to a communications protocol and receive circuitry 202 may be capable of receiving one or more signals (for example, from mass storage 150) according to a communications protocol. Transmit circuitry 148 may be capable of generating differential and/or common mode and differential output signals, which may include differential output signals tx and tx_b, which may represent a complementary pair of differential signals.

AFE circuitry 144 may also comprise one or more termination resistors. In this embodiment, a termination resistor, Rterm, may be coupled to each respective output of transmit circuitry 148. Similarly, in this embodiment, a termination resistor, Rterm, may be coupled to each respective input of receive circuitry 202. One or more Rterms depicted in FIG. 2 may comprise a variable resistor. The resistance value of Rterm may be controlled, i.e., the resistance value may be adjusted and set. Also, in this embodiment, each respective Rterm represented in FIG. 2 may comprise an equivalent resistance, and each respective Rterm may comprise one or more resistors having an equivalent resistance of Rterm depicted in FIG. 2. Further, each respective termination resistor, Rterm, may be approximately equal resistance. Alternatively, each respective termination resistor, Rterm, may have a different resistance value from other respective Rterms.

As stated, Tx circuitry 148 may be capable of transmitting one or more signals that comply with a communications protocol (e.g., FC, SAS, and/or SATA), among a plurality of communication protocols. In this embodiment, tx and tx_b signals, as may be transmitted by Tx circuitry 148, may comply with a FC, SAS and/or SATA communication protocol. Depending, at least in part, on a particular communications protocol, transmit circuitry 148 may be capable of generating signals having an amplitude that complies or is compatible with a particular communications protocol. To that end, Tx circuitry 148 may receive a reference current, Itrx. Itrx may be a reference current that complies with a communication protocol. Tx circuitry may generate a plurality of signals, and generate a plurality of signals having an amplitude that complies or is compatible with a particular communications protocol, based on, at least in part, the relative amplitude of Itrx.

IC 140, in this embodiment, may also comprise calibration controller circuitry 146. Calibration controller circuitry 146 may be capable of generating one or more reference signals, Itrx, for transmit circuitry 148. Calibration controller circuitry 146 may also be capable of generating one or more resistance value control signals. As used in any embodiment herein, a "resistance value control signal" may comprise a signal capable of controlling a resistance value for at least one termination resistor (Rterm). The resistance value of at least one termination resistor, Rterm, may comply or be compatible with a selected communication protocol, among a plurality of communication protocols.

Figure 3:
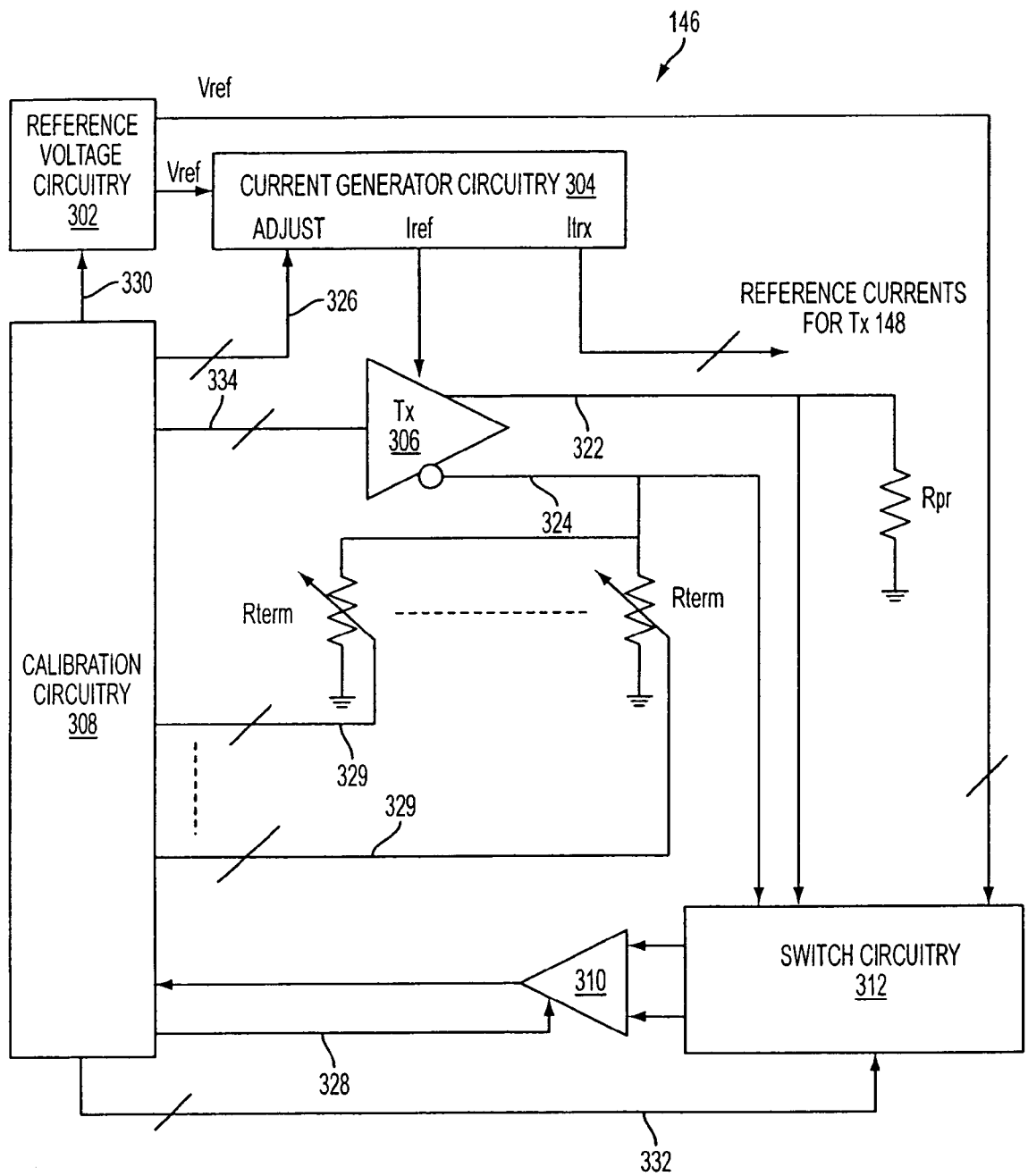
FIG. 3 is a diagram illustrating in more detail calibration controller circuitry according to an embodiment.

FIG. 3 illustrates one exemplary embodiment of calibration controller circuitry 146 depicted in FIG. 1 and/or 2. In FIG. 3, certain portions of the system 100 depicted in FIG. 1 and the integrated circuit 140 of FIG. 2 have been omitted for clarity (for example, AFE circuitry 144, circuit board 132 and circuit card 120), but it is to be understood that like parts of FIG. 3 can be implemented in a manner consistent with an embodiment depicted in FIG. 1 and/or 2, or alternatively in other system implementations, without departing from this embodiment.

Calibration controller circuitry 146 may be capable of generating at least one reference signal and/or at least one resistance value control signal using a single calibration comparator to control the generation of at least one reference signal and/or at least one resistance value control signal. In this embodiment, calibration controller circuitry 146 may include reference voltage circuitry 302 which may be capable of generating a reference voltage, Vref, having an amplitude that may correspond to, or comply with, at least one communication protocol, among a plurality of communication protocols. Reference voltage circuitry 302, as will be described in greater detail below, may be capable of generating a plurality of scaled reference voltages, depending on, for example, a particular calibration operation and/or operating mode of integrated circuit 140. Thus, for example, reference voltage circuitry 302 may be capable of generating a first reference voltage to calibrate Iref, and a second reference voltage to calibrate one or more Rterms.

Calibration controller circuitry 146 may also include current generator circuitry 304 which may be capable of receiving one or more reference voltages Vref and generating at least one calibration reference current, Iref, and at least one reference signal, Itrx. In this embodiment, calibration reference current, Iref, may comprise a signal that is proportional to, and/or have an amplitude based on, the value of Vref. Also, in this embodiment, current generator circuitry 304 may be capable of duplicating and/or scaling Iref to create one or more Itrx signals.

Calibration controller circuitry 146 may also include calibration transmit (Tx) circuitry 306. Calibration Tx circuitry 306 may be capable of receiving Iref and generating a plurality of first current signals 322 and a plurality of second current signals 324. First and second current signals 322 and/or 324 may be proportional to Iref. A precision resistor, Rpr, may be coupled to an output of calibration Tx circuitry 306. Rpr may be capable of generating a first voltage drop, which may be proportional to the first current signal 322. In this embodiment, Rpr may comprise a resistor having a resistance value that is within a desired tolerance and/or within an acceptable tolerance range for a selected application. Tx circuitry 306 may be capable of receiving one or more scaling control signals 334 (as may be generated by calibration circuitry 308). Scaling control signals 334 may be capable of scaling one or more outputs of Tx circuitry 306, for example, calibrate a selected Rterm (as described herein) and/or to comply with a selected communication protocol. In this embodiment, calibration Tx circuitry 306 may comprise circuitry that may be identical to, or approximately identical to, Tx circuitry 148 of FIG. 1 and/or 2. The term "approximately", as used in any embodiment herein, may mean that an element described herein is that it is within a desired tolerance and/or within an acceptable tolerance range for a selected application.

The second current signal 324, as may be generated by calibration Tx circuitry 306, may be supplied to at least one termination resistor, Rterm. A second voltage drop may be developed across one or more termination resistors, which may be proportional to the second current signal 324.

Calibration controller circuitry 146 may also include a switch array 312 which may includes one or more switches capable of controlling the passing of an input signal of the switch array 312 to an output of the switch array 312. A "switch", as used in any embodiment herein, may comprise circuitry capable of changing conduction states and may include, for example, at least one field-effect transistor (FET) and/or bi-polar junction transistor (BJT). For example, switch array 312 may be capable of receiving at least one of Vref, the first voltage drop (as may be generated across Rpr, described above), and/or the second voltage drop (as may be generated across at least one Rterm, described above). Switch array 312 may also be capable of controllably passing, as outputs thereof, one or more of Vref, the first voltage drop and/or the second voltage drop.

Calibration controller circuitry 146 may also include comparator 310. In this embodiment, comparator 310 may be capable of comparing the relative value of at least two signals, as may be passed from switch circuitry 312. Comparator 310 may also be capable of generating an output signal proportional to the difference between two or more input signals supplied thereto. Calibration controller circuitry 146 may also include calibration circuitry 308 which may be capable of controlling one or more aforementioned elements of calibration controller circuitry 146 to perform closed loop and/or open loop calibration of at least one of Itrx, Rterm, Vref, and/or an offset of comparator 310, in a manner described in more detail below.

Vref Calibration

In at least one embodiment, and although not shown in the drawings, bandgap reference voltage circuitry 302 may comprise amplifier circuitry capable of generating Vref. Such amplifier circuitry may include an offset, which may introduce error into the value of Vref. Accordingly, calibration controller circuitry 146 may be capable of calibrating Vref to reduce or eliminate an offset which may be associated with bandgap reference voltage circuitry 302.

Vref calibration operations may include, for example, calibrating amplifier circuitry comprised in bandgap reference voltage circuitry 302 by setting the inputs of the amplifier to or nearly equal to one another and adjusting the amplifier so that the output is approximately in the middle of its operating output range. In at least one embodiment, Vref may be calibrated, for example, in a manner described above, before other calibration operations of calibration controller circuitry 146.

Comparator 310 Calibration

Calibration controller circuitry 146 may also be capable of calibrating comparator 310 to reduce or eliminate an offset which may be associated with comparator 310. Comparator 310 calibration operations may include operations consistent with those used in calibrating the bandgap reference voltage circuitry 302 (as described above). In at least one embodiment, comparator 310 may be calibrated, for example, in a manner described above, after Vref may be calibrated (as described above) and before other calibration operations of calibration controller circuitry 146.

Iref Calibration

Calibration controller circuitry 146 may also be capable of calibrating Iref. As stated, Iref, as may be generated by current generator circuitry 304, may be proportional to Vref. Also, reference voltage circuitry 302 may be controlled by calibration circuitry 302 to generate a reference voltage Vref that may be used to calibrate Iref. Tx circuitry 306 may receive Iref and generate a first output signal 322 which may be proportional to Iref. The first voltage drop signal across Rpr, which may be proportional to the first output signal 322 and Vref may be supplied to switching circuitry 312. Calibration circuitry 308 may be capable of controlling one or more switches comprised in switch circuitry 312 (via one or more switch control signal 332) to pass the first voltage drop signal and Vref to comparator 310. Comparator 310 may be capable of determining the difference between Vref and the first voltage drop signal (i.e., error). In other words, comparator 310 may be capable of determining if Vref is greater than or less than, or approximately greater than or less than, the first voltage drop signal. A difference, or an amplified or saturated difference, between these two signals may be supplied to calibration circuitry 308. Calibration circuitry 308, based at least in part on information received from comparator 310, may be capable of generating a control signal 326 (adjust) to current generator circuitry 304. Current generator circuitry 304, based at least in part on control signal 326, may be capable of adjusting the value of Iref. These operations may be repeated until, for example, the value of Iref is set approximately proportional to Vref.

As stated, current generator circuitry 304 may be capable of duplicating and/or scaling Iref to create one or more reference currents, Itrx. Referring again to FIG. 1, as stated, integrated circuit 140 may comprise a plurality of protocol engines 142, and a corresponding number of respective transmit circuitry 148. Each transmit circuitry 148 may use Itrx as a reference current, as may be generated by current controller circuitry 304, to generate one or more signals that comply with, or are compatible with, a communication protocol among a plurality of communication protocols. Thus, in this embodiment, a single comparator (i.e., comparator 310) may be used to calibrate a plurality of reference current signals, and thus, errors associated with multiple comparators may be reduced or eliminated. Also, in at least one embodiment, Iref may be calibrated, for example, in a manner described above, after Vref and/or comparator 310 may be calibrated (as described above) and before other calibration operations of calibration controller circuitry 146.

Rterm Calibration

Calibration controller circuitry 146 may also be capable of calibrating at least one resistance value of at least one Rterm. As stated, Iref, as may be generated by current generator circuitry 304, may be proportional to Vref. Also, reference voltage circuitry 302 may be controlled by calibration circuitry 302 to generate a reference voltage Vref that may be used to calibrate one or more Rterms. Tx circuitry 306 may receive Iref and generate a second output signal 324 which may be proportional to Iref. Calibration circuitry 308 may select one or more Rterms, among a plurality of Rterms, (via one or more control lines 329) and the second output signal 324 may generate the second voltage drop across one or more selected Rterms. The second voltage drop and Vref may be supplied to switching circuitry 312. Calibration circuitry 308 may be capable of controlling one or more switches comprised in switch circuitry 312 (via one or more switch control signal 332) to pass the second voltage drop signal and Vref to comparator 310. Comparator 310 may be capable of determining the difference between Vref and the second voltage drop signal (i.e., error). In other words, comparator 310 may be capable of determining if Vref is greater than or less than, or approximately greater than or less than, the second voltage drop signal. A difference, or an amplified or saturated difference, between these two signals may be supplied to calibration circuitry 308. Calibration circuitry 308, based at least in part on information received from comparator 310, may be capable of generating a control signal 329 to one or more Rterms. The Rterm, based at least in part on control signal 329, may be capable of adjusting the value of the Rterm resistance. These operations may be repeated until, for example, the value of the second voltage drop across Rterm is set approximately proportional to, and/or approximately equal to, Vref. The result of these operations may be a resistance value control signal capable of setting a resistance value for one or more Rterms.

Referring again to FIG. 1, as stated, integrated circuit 140 may comprise a plurality of protocol engines 142, and a corresponding number of respective transmit circuitry 148. Each transmit circuitry 148 may use respective Rterms 149, to generate one or more signals that comply with, or are compatible with, a communication protocol among a plurality of communication protocols. Thus, in this embodiment, a single comparator (i.e., comparator 310) may be used to calibrate the resistance value of a plurality of Rterms, and thus, errors associated with multiple comparators may be reduced or eliminated. Also, in at least one embodiment, Rterm may be calibrated, for example, in a manner described above, after Iref, and/or Vref and/or comparator 310 may be calibrated (as described above) and before transmit circuitry 148 begins transmitting commands and/or data signals.

Figure 4B:
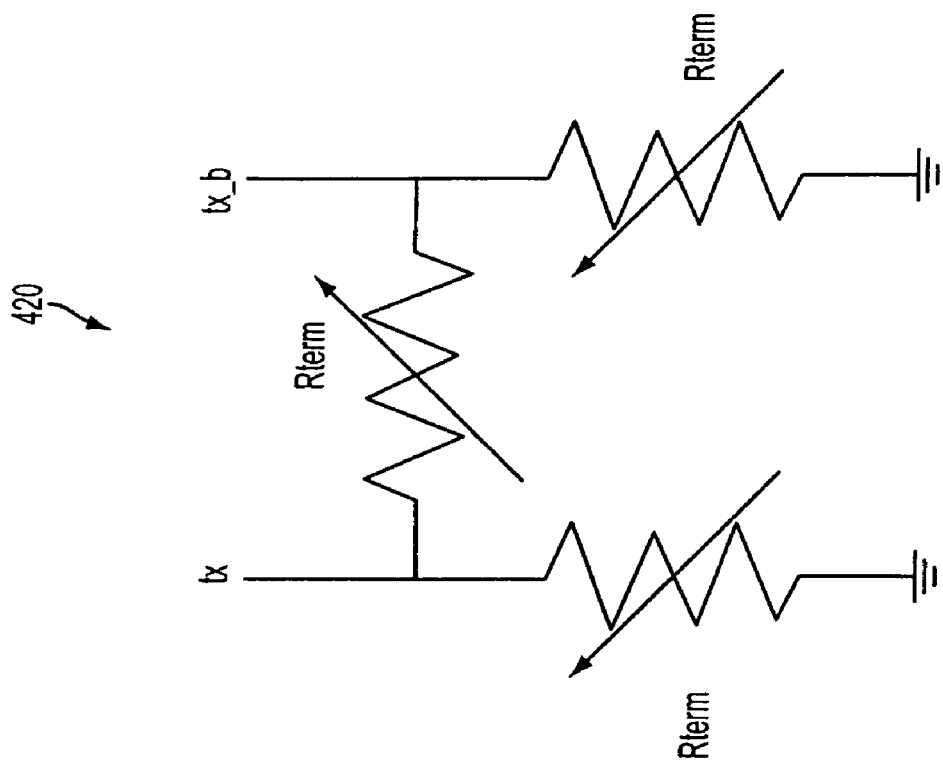
FIG. 4B is a diagram illustrating exemplary differential and common mode resistance circuitry according to an embodiment.
Figure 4A:
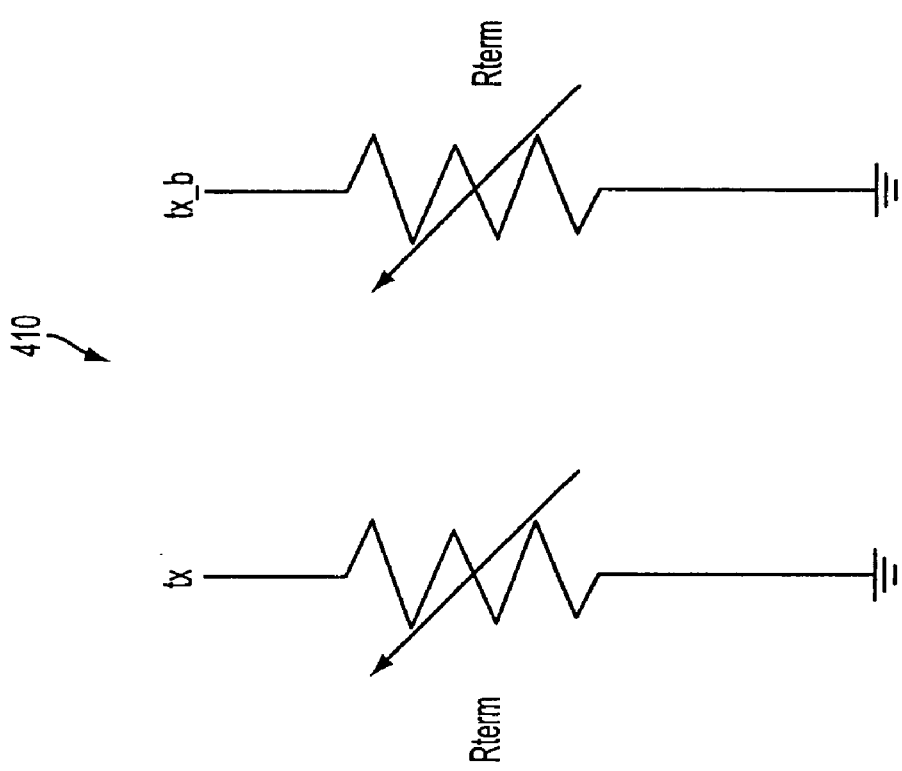
FIG. 4A is a diagram illustrating exemplary differential resistance circuitry according to an embodiment.

FIG. 4A is a diagram illustrating exemplary differential resistance circuitry 410 according to an embodiment. Differential resistance circuitry 410 may comprise a variable resistor Rterm coupled to each leg of the transmission signals tx and tx_b, and generally depicts an example of differential output signals when transmit circuitry 148 is communicating using a communication protocol that uses a differential mode of operation. For example, a FC communication protocol may use differential resistance circuitry 410 to generate a differential pair of signals (tx and tx_b). FIG. 4B is a diagram illustrating exemplary differential and common mode resistance circuitry 410 according to an embodiment. Differential and common mode resistance circuitry 410 may comprise a variable resistor Rterm coupled to each leg of the transmission signals tx and tx_b, and another termination resistor Rterm coupled between each leg, and generally depicts an example of differential output signals when transmit circuitry 148 is communicating using a communication protocol that uses a differential mode of operation. For example, a SAS and/or SATA communication protocol may use differential and common mode resistance circuitry 420 to generate a differential pair of signals (tx and tx_b). Integrated circuit 140 may be capable of selecting between circuitry 410 and circuitry 420, depending on, at least in part, a communications protocol used by integrated circuit 140, among a plurality of communication protocols. Each of the termination resistors, Rterms, may be set according to operations described above.

Figure 5:
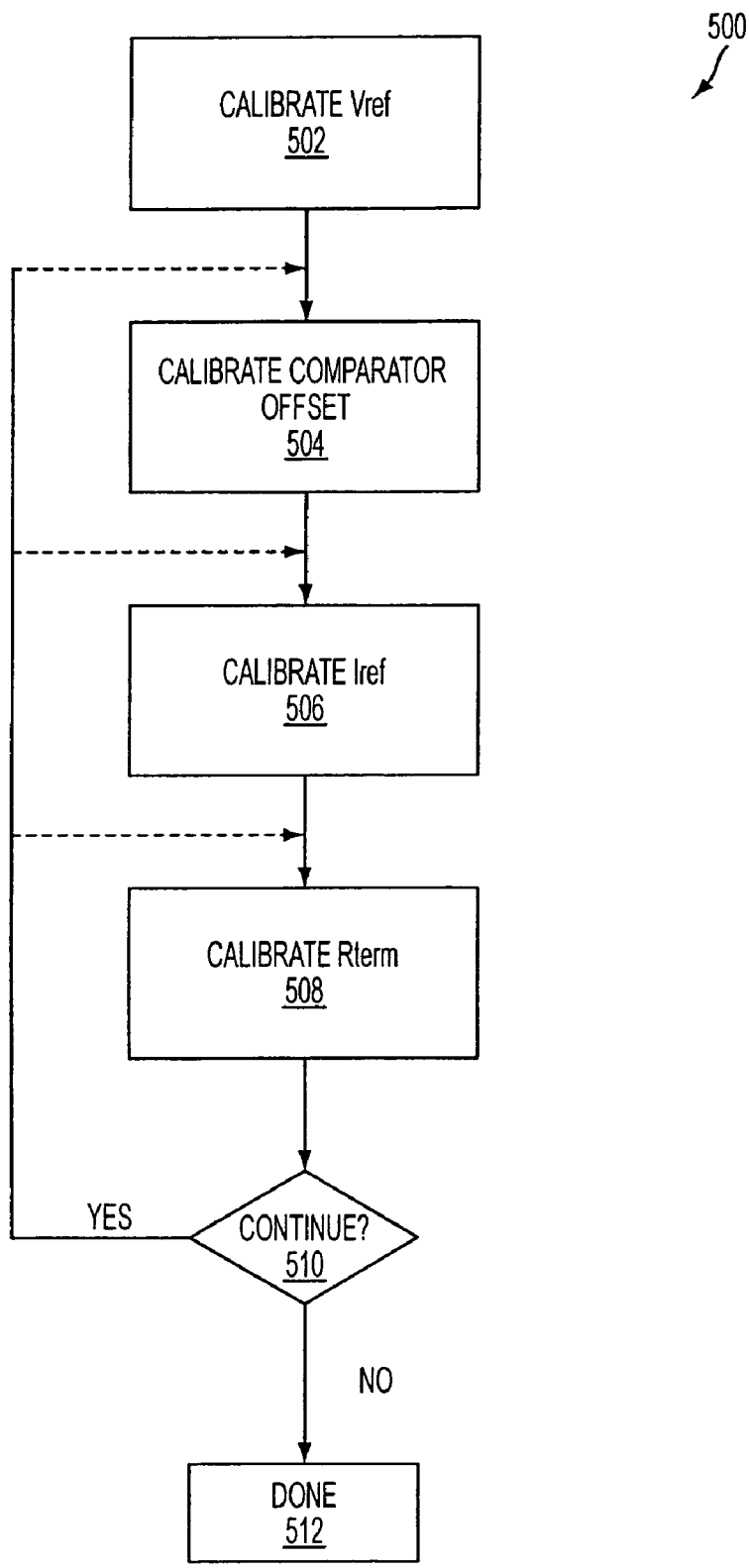
FIG. 5 is a flowchart illustrating exemplary operations according to an embodiment.

FIG. 5 is a flowchart 500 illustrating exemplary operations according to an embodiment. Operations may include calibrating reference voltages Vref 502. This calibration may include reducing or eliminating an offset of circuitry responsible for generating the reference voltages Vref. Operations may also include calibrating the offset of a comparator 504 used in calibrating other parameters. This calibration may include reducing or eliminating an offset of the comparator. Operations may further include calibrating at least one reference current Iref 506 using the comparator calibrated in the previous operation. This operation may include comparing, by the comparator, the reference voltage to the reference current. This operation may continue until, for example, Vref is approximately equal to a signal proportional to Iref. Operations may further include calibrating a resistance value control signal of a termination resistor, Rterm, 508. This operation may include comparing, by the comparator, the reference voltage to the resistance value control signal. This operation may continue until, for example, Vref is approximately equal to a signal proportional to a resistance represented by a resistance value control signal.

Advantageously, the integrated circuit of at least one embodiment provided herein may offer enhanced calibration and reduced error in calibrating a plurality of parameters. For example, using a single comparator to calibrate Iref and Rterm may operate to reduce errors which may be present if more than one comparator is used. Also, calibrating Vref and/or the comparator to reduce or eliminate offset may further enhance error reduction.

Also, embodiments herein describe the operations of one or more integrated circuits comprised in circuit card 120, however, it should be understood that other integrated circuits may be capable of such operations, for example, integrated circuits comprised in host system 132 and or other integrated circuits not shown herein.

Thus, in summary, one embodiment provided herein may provide an integrated circuit that may include calibration controller circuitry comprising a comparator. The calibration controller circuitry may be capable of generating at least one reference voltage, and calibrating said at least one reference current signal by comparing, by said comparator, said reference current signal and at least one said reference voltage, said calibration controller circuitry may also be capable of calibrating at least one resistance value control signal, by comparing, by said comparator, said at least one resistance value control signal and at least one said reference voltage.

One system embodiment may comprise a circuit card including an integrated circuit. The circuit card may be capable of being coupled to a bus. The integrated circuit may include calibration controller circuitry comprising a comparator. The calibration controller circuitry may be capable of generating at least one reference voltage, and calibrating said at least one reference current signal by comparing, by said comparator, said reference current signal and at least one said reference voltage, said calibration controller circuitry may also be capable of calibrating at least one resistance value control signal, by comparing, by said comparator, said at least one resistance value control signal and at least one said reference voltage.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. An apparatus, comprising:
an integrated circuit comprising a calibration controller circuitry comprising a comparator;
the calibration controller circuitry is capable of generating at least one reference voltage, and calibrating at least one reference current signal by comparing, by said comparator, a signal proportional to said reference current signal and at least one said reference voltage;
said calibration controller circuitry is also capable of calibrating at least one resistance value control signal, by comparing, by said comparator, a signal proportional to said at least one resistance value control signal and at least one said reference voltage;

wherein said calibration controller circuitry further comprising a reference voltage circuitry capable of generating at least one said reference voltage, wherein said calibration controller circuitry is further capable of calibrating said reference voltage circuitry by reducing an offset of said reference voltage circuitry.

2. The apparatus of claim 1, wherein:
said calibration controller circuitry is further capable of calibrating said comparator by reducing an offset of said comparator.

3. The apparatus of claim 1, wherein:
said calibration controller circuitry further comprising current generator circuitry capable of generating said reference current signal based on, at least in part, said reference voltage, and circuitry capable of generating said signal proportional to said reference current signal based on, at least in part, said reference current signal; said calibration controller circuitry is further capable of adjusting the value of said reference current signal based on, at least in part, said comparing, by said comparator, said signal proportional to said reference current signal and at least one said reference voltage.

4. The apparatus of claim 1, wherein:
said calibration controller circuitry further comprising current generator circuitry capable of generating said reference current signal based on, at least in part, said reference voltage, and circuitry capable of generating said signal proportional to said at least one resistance value control signal based on, at least in part, said reference current signal; said calibration controller circuitry is further capable of adjusting the value of said resistance value control signal based on, at least in part, said comparing, by said comparator, said signal proportional to said resistance value control signal and at least one said reference voltage.

5. The apparatus of claim 1, wherein:
said calibration controller circuitry further comprising switch circuitry capable of being controlled to pass, to said comparator, said reference voltage and at least one of said signal proportional to said reference current signal said signal proportional to said at least one resistance value control signal.

6. The apparatus of claim 1, wherein:
said resistance value control signal is capable of setting a resistance value for at least one resistor.

7. A system, comprising:
a circuit card comprising an integrated circuit, the circuit card being capable of being coupled to a bus, said integrated circuit comprising a calibration controller circuitry comprising a comparator;
the calibration controller circuitry is capable of generating at least one reference voltage, and calibrating at least one reference current signal by comparing, by said comparator, a signal proportional to said reference current signal and at least one said reference voltage;
said calibration controller circuitry is also capable of calibrating at least one resistance value control signal, by comparing, by said comparator, a signal proportional to said at least one resistance value control signal and at least one said reference voltage;
wherein said calibration controller circuitry further comprising a reference voltage circuitry capable of generating at least one said reference voltage, wherein said calibration controller circuitry is further capable of calibrating said reference voltage circuitry by reducing an offset of said reference voltage circuitry.

8. The system of claim 7, wherein:
said calibration controller circuitry further comprising switch circuitry capable of being controlled to pass, to said comparator, said reference voltage and at least one of said signal proportional to said reference current signal said signal proportional to said at least one resistance value control signal.

9. The system of claim 7, wherein:
said resistance value control signal is capable of setting a resistance value for at least one resistor.

10. The system of claim 7, wherein: said calibration controller circuitry is further capable of calibrating said comparator by reducing an offset of said comparator.

11. The system of claim 7, wherein:
said calibration controller circuitry further comprising current generator circuitry capable of generating said reference current signal based on, at least in part, said reference voltage, and circuitry capable of generating said signal proportional to said reference current signal based on, at least in part, said reference current signal; said calibration controller circuitry is further capable of adjusting the value of said reference current signal based on, at least in part, said comparing, by said comparator, said signal proportional to said reference current signal and at least one said reference voltage.

12. The system of claim 7, wherein:
said calibration controller circuitry further comprising current generator circuitry capable of generating said reference current signal based on, at least in part, said reference voltage, and circuitry capable of generating said signal proportional to said at least one resistance value control signal based on, at least in part, said reference current signal; said calibration controller circuitry is further capable of adjusting the value of said resistance value control signal based on, at least in part, said comparing, by said comparator, said signal proportional to said resistance value control signal and at least one said reference voltage.

13. An article comprising:
a storage medium having stored thereon instructions that when executed by a machine result in the following operations:
generating, by an integrated circuit comprising a calibration controller circuitry comprising a comparator, at least one reference voltage;
calibrating, by said calibration controller circuitry, at least one reference current signal by comparing, by said comparator, a signal proportional to said reference current signal and at least one said reference voltage;
calibrating, by said calibration controller circuitry, at least one resistance value control signal, by comparing, by said comparator, a signal proportional to said at least one resistance value control signal and at least one said reference voltage; and
wherein said instructions that when executed by said machine result in the following additional operations:
generating at least one said reference voltage by a reference voltage circuitry; and
calibrating, by said calibration controller circuitry, said reference voltage circuitry by reducing an offset of said reference voltage circuitry.

14. The article of claim 13, wherein said instructions that when executed by said machine result in the following additional operations:
generating, by current generator circuitry, said reference current signal based on, at least in part, said reference voltage;

generating, by circuitry, signal proportional said at least one resistance value control signal based on, at least in part, said reference current signal; and adjusting, by said calibration controller circuitry, the value of said at least one resistance value control signal based on, at least in part, said comparing, by said comparator, said signal proportional to said at least one resistance value control signal and at least one said reference voltage.

15. The article of claim 13, wherein said instructions that when executed by said machine result in the following additional operations:

controllably passing, by switch circuitry, to said comparator, said reference voltage and at least one of said signal proportional to said reference current signal and said signal proportional to said at least one resistance value control signal.

16. The article of claim 13, wherein said instructions that when executed by said machine result in the following additional operations:

setting a resistance value for at least one resistance value control signal.

17. The article of claim 13, wherein said instructions that when executed by said machine result in the following additional operations:

calibrating, by said calibration controller circuitry, said comparator by reducing an offset of said comparator.

18. The article of claim 13, wherein said instructions that when executed by said machine result in the following additional operations:

generating, by current generator circuitry, said reference current signal based on, at least in part, said reference voltage;

generating, by circuitry, said signal proportional to said reference current signal based on, at least in part, said reference current signal; and adjusting, calibration controller circuitry, the value of said reference current signal based on, at least in part, said comparing, by said comparator, said signal proportional to said reference current signal and at least one said reference voltage.

19. A method, comprising:

generating, by an integrated circuit comprising a calibration controller circuitry comprising a comparator, at least one reference voltage;

calibrating, by said calibration controller circuitry, at least one reference current signal by comparing, by said comparator, a signal proportional to said reference current signal and at least one said reference voltage;

calibrating, by said calibration controller circuitry, at least one resistance value control signal, by comparing, by said comparator, a signal proportional to said at least one resistance value control signal and at least one said reference voltage;

generating at least one said reference voltage by a reference voltage circuitry; and calibrating, by said calibration controller circuitry, said reference voltage circuitry by reducing an offset of said reference voltage circuitry.

20. The method of claim 19, further comprising:

generating, by current generator circuitry, said reference current signal based on, at least in part, said reference voltage;

generating, by circuitry, said signal proportional to said reference current signal based on, at least in part, said reference current signal; and adjusting, calibration controller circuitry, the value of said reference current signal based on, at least in part, said comparing, by said comparator, said signal proportional to said reference current signal and at least one said reference voltage.

21. The method of claim 19, further comprising:

generating, by current generator circuitry, said reference current signal based on, at least in part, said reference voltage;

generating, by circuitry, said signal proportional said at least one resistance value control signal based on, at least in part, said reference current signal; and adjusting, by said calibration controller circuitry, the value of said at least one resistance value control signal based on, at least in part, said comparing, by said comparator, said signal proportional to said at least one resistance value control signal and at least one said reference voltage.

22. The method of claim 19, further comprising:

controllably passing, by switch circuitry, to said comparator, said reference voltage and at least one of said signal proportional to said reference current signal and said signal proportional to said at least one resistance value control signal.

23. The method of claim 19, further comprising:

setting a resistance value for at least one resistor based on said resistance value control signal.

24. The method of claim 19, further comprising:

calibrating, by said calibration controller circuitry, said comparator by reducing an offset of said comparator.

* * * * *